(12) United States Patent
Miyamoto

(10) Patent No.: US 10,229,848 B2
(45) Date of Patent: Mar. 12, 2019

(54) SUBSTRATE ALIGNMENT APPARATUS, SUBSTRATE PROCESSING APPARATUS, SUBSTRATE ARRANGEMENT APPARATUS, SUBSTRATE ALIGNMENT METHOD, SUBSTRATE PROCESSING METHOD, AND SUBSTRATE ARRANGEMENT METHOD

(71) Applicant: SCREEN Holdings Co., Ltd., Kyoto (JP)

(72) Inventor: Yukiteru Miyamoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/693,708

(22) Filed: Sep. 1, 2017

(65) Prior Publication Data
US 2018/0090360 A1    Mar. 29, 2018

(30) Foreign Application Priority Data
Sep. 29, 2016   (JP) ................. 2016-190860

(51) Int. Cl.
| | |
|---|---|
| *H01L 21/00* | (2006.01) |
| *H01L 21/68* | (2006.01) |
| *H01L 21/687* | (2006.01) |
| *H01L 21/67* | (2006.01) |
| *H01L 21/02* | (2006.01) |
| *H01L 21/677* | (2006.01) |

(52) U.S. Cl.
CPC ........ *H01L 21/68* (2013.01); *H01L 21/02057* (2013.01); *H01L 21/67023* (2013.01); *H01L 21/67288* (2013.01); *H01L 21/67781* (2013.01); *H01L 21/68771* (2013.01)

(58) Field of Classification Search
CPC ...................................... H01L 21/68
See application file for complete search history.

(56) References Cited

U.S. PATENT DOCUMENTS

| | | | | |
|---|---|---|---|---|
| 5,511,005 A | * | 4/1996 | Abbe | ............... H01L 22/20 257/E21.525 |
| 6,327,512 B1 | * | 12/2001 | Hirata | ............... H01L 21/67259 700/114 |
| 6,401,554 B1 | * | 6/2002 | Mori | ............... H01L 21/67288 73/1.81 |

(Continued)

FOREIGN PATENT DOCUMENTS

| | | |
|---|---|---|
| JP | 2008-078544 | 4/2008 |
| JP | 2010-093230 | 4/2010 |

(Continued)

*Primary Examiner* — William Harriston
(74) *Attorney, Agent, or Firm* — Ostrolenk Faber LLP

(57) ABSTRACT

In a substrate alignment apparatus, a motor sequentially rotates a plurality of substrates in a circumferential direction, the substrates being to be held in a vertical posture at a lower edge portion by a substrate holder. A controller controls the motor on the basis of warpage-and-notch-position information and input information that is input about a warped state of the substrates, to determine circumferential positions of the notches of the substrates. This reduces a distance in a thickness direction between a lower edge portion and an upper edge of each substrate that is held by the substrate holder. As a result, it is possible to facilitate handling of a plurality of substrates held by the substrate holder.

12 Claims, 9 Drawing Sheets

(56) References Cited

U.S. PATENT DOCUMENTS

| | | | |
|---|---|---|---|
| 6,591,160 B2* | 7/2003 | Hine | H01L 21/67259 |
| | | | 700/189 |
| 7,453,160 B2* | 11/2008 | Ray | H01L 21/67259 |
| | | | 257/797 |
| 8,002,511 B2* | 8/2011 | Kamikawa | H01L 21/67718 |
| | | | 414/404 |
| 2006/0137726 A1 | 6/2006 | Sano et al. | 134/61 |
| 2007/0238062 A1* | 10/2007 | Asari | F27B 17/0025 |
| | | | 432/253 |
| 2008/0138175 A1 | 6/2008 | Mitchell et al. | 414/217 |
| 2009/0162172 A1* | 6/2009 | Miyamoto | H01L 21/67265 |
| | | | 414/226.01 |
| 2010/0068014 A1 | 3/2010 | Mitsuyoshi et al. | 414/225.01 |
| 2012/0089251 A1 | 4/2012 | Coady | 700/228 |
| 2014/0081457 A1* | 3/2014 | Kobayashi | H01L 21/68 |
| | | | 700/254 |
| 2015/0153729 A1 | 6/2015 | Kurahashi et al. | |
| 2017/0011941 A1* | 1/2017 | Kato | H01L 21/67103 |
| 2017/0178930 A1* | 6/2017 | Onzuka | H01L 21/30604 |
| 2018/0090356 A1* | 3/2018 | Miyamoto | H01L 21/67718 |

FOREIGN PATENT DOCUMENTS

| | | |
|---|---|---|
| TW | 200836287 A | 9/2008 |
| TW | 201523760 A | 6/2015 |

* cited by examiner

SUBSTRATE ALIGNMENT APPARATUS, SUBSTRATE PROCESSING APPARATUS, SUBSTRATE ARRANGEMENT APPARATUS, SUBSTRATE ALIGNMENT METHOD, SUBSTRATE PROCESSING METHOD, AND SUBSTRATE ARRANGEMENT METHOD

TECHNICAL FIELD

The present invention relates to a technique for aligning a plurality of substrates each having a notch in a peripheral portion.

BACKGROUND ART

Substrate processing apparatuses that perform various types of processing on substrates have conventionally been used in the process of manufacturing semiconductor substrates (hereinafter, simply referred to as "substrates"). For example, Japanese Patent Application Laid-Open No. 2010-93230 (Document 1) discloses a batch-type substrate processing apparatus that processes a plurality of substrates by one operation. With the substrate processing apparatus in Document 1, a plurality of substrates held in a horizontal posture and arranged along the thickness (hereinafter, referred to as a "thickness direction") of the substrates are carried into the apparatus by a batch hand. Then, a posture changing mechanism changes the posture of the plurality of substrates to a vertical posture at once and then collectively transfers the substrates to a pusher. This substrate processing apparatus includes a substrate-direction alignment mechanism for aligning the directions of a plurality of substrates that are held in a vertical posture by a chuck. The substrate-direction alignment mechanism aligns a plurality of substrates so that the orientations (i.e., circumferential positions) of notches provided in peripheral portions of the substrates match one another.

Japanese Patent Application Laid-Open No. 2008-78544 (Document 2) discloses an example of the structure of a substrate alignment apparatus. This substrate alignment apparatus aligns a plurality of substrates by rotating the substrates held in a vertical posture via a driving roller and stopping the rotation when a notch of each substrate has engaged with an engagement shaft that extends in the direction of arrangement of the substrates.

By the way, substrates to be processed by a substrate processing apparatus may be warped under the influence of processing performed before transport to the substrate processing apparatus. The sizes in the thickness direction of warped substrates are larger than those of flat substrates. Thus, the substrates held in a vertical posture by, for example, the pusher of Document 1 may excessively approach or come into contact with adjacent substrates. While the aforementioned batch hand supports two side portions of the substrates in a horizontal posture from the underside, it is difficult for the batch hand to stably support and transport warped substrates.

SUMMARY OF INVENTION

The present invention is intended for a substrate alignment apparatus, and it is an object of the present invention to facilitate handling of a plurality of substrates held by a substrate holder. The present invention is also intended for a substrate alignment method.

A substrate alignment apparatus according to the present invention aligns a plurality of substrates, each substrate having a notch in a peripheral portion. This substrate alignment apparatus includes a rotor for rotating a plurality of substrates either sequentially or simultaneously in a circumferential direction, the plurality of substrates being to be held in a vertical posture at a lower edge portion by a substrate holder, a storage for storing warpage-and-notch-position information that includes a plurality of combinations of a warped state of the plurality of substrates and a notch position at which a substrate in the warped state is held in a proper posture by the substrate holder, and a controller for controlling the rotor. The controller controls the rotor on the basis of the warpage-and-notch-position information and input information that is input about the warped state of the plurality of substrates, to rotate the plurality of substrates either sequentially or simultaneously in the circumferential direction and determine positions in the circumferential direction of the notches of the plurality of substrates and thereby to reduce a distance in a thickness direction between a lower edge portion and an upper edge of each substrate that is held by the substrate holder. With this substrate alignment apparatus, it is possible to facilitate handling of a plurality of substrates held by the substrate holder.

The present invention is also intended for a substrate processing apparatus. The substrate processing apparatus includes the aforementioned substrate alignment apparatus, the substrate holder for holding the plurality of substrates aligned by the substrate alignment apparatus, and a liquid processing part for retaining a processing liquid in which the plurality of substrates held by the substrate holder are to be immersed. The present invention is also intended for a substrate processing method.

The present invention is also intended for a substrate arrangement apparatus. The substrate arrangement apparatus includes the aforementioned substrate alignment apparatus, the substrate holder for holding the plurality of substrates aligned by the substrate alignment apparatus, and a substrate arrangement mechanism for disposing each of the plurality of substrates held by the substrate holder between each pair of another plurality of substrates that are held by another substrate holder. The present invention is also intended for a substrate arrangement method.

Another substrate alignment apparatus according to the present invention aligns a plurality of substrates, each having a notch in a peripheral portion. The substrate alignment apparatus includes a rotor for rotating a plurality of substrates either sequentially or simultaneously in a circumferential direction, the plurality of substrates being to be supported in a horizontal posture at a lower surface by a substrate holder, a storage for storing warpage-and-notch-position information that includes a plurality of combinations of a warped state of the plurality of substrates and a notch position at which a substrate in the warped state is held in a proper posture by the substrate holder, and a controller for controlling the rotor. The controller controls the rotor on the basis of the warpage-and-notch-position information and input information that is input about the warped state of the plurality of substrates, to rotate the plurality of substrates either sequentially or simultaneously in the circumferential direction and determine positions in the circumferential direction of the notches of the plurality of substrates and thereby to reduce a distance in a thickness direction between a top of each substrate that is held by the substrate holder and an area of contact of the peripheral portion of the substrate with the substrate holder. With this substrate alignment apparatus, it is possible to facilitate handling of a plurality of substrates held by the substrate holder.

In the aforementioned substrate alignment apparatus, for example, each substrate is curved in a first radial direction to one side in the thickness direction with a first curvature, and is curved in a second radial direction orthogonal to the first radial direction to the one side in the thickness direction with a second curvature greater than the first curvature.

In the aforementioned substrate alignment apparatus, for example, each substrate is curved in a first radial direction to one side in the thickness direction, and is curved in a second radial direction orthogonal to the first radial direction to the other side in the thickness direction.

These and other objects, features, aspects and advantages of the present invention will become more apparent from the following detailed description of the present invention when taken in conjunction with the accompanying drawings.

DESCRIPTION OF EMBODIMENTS

Figure 1:
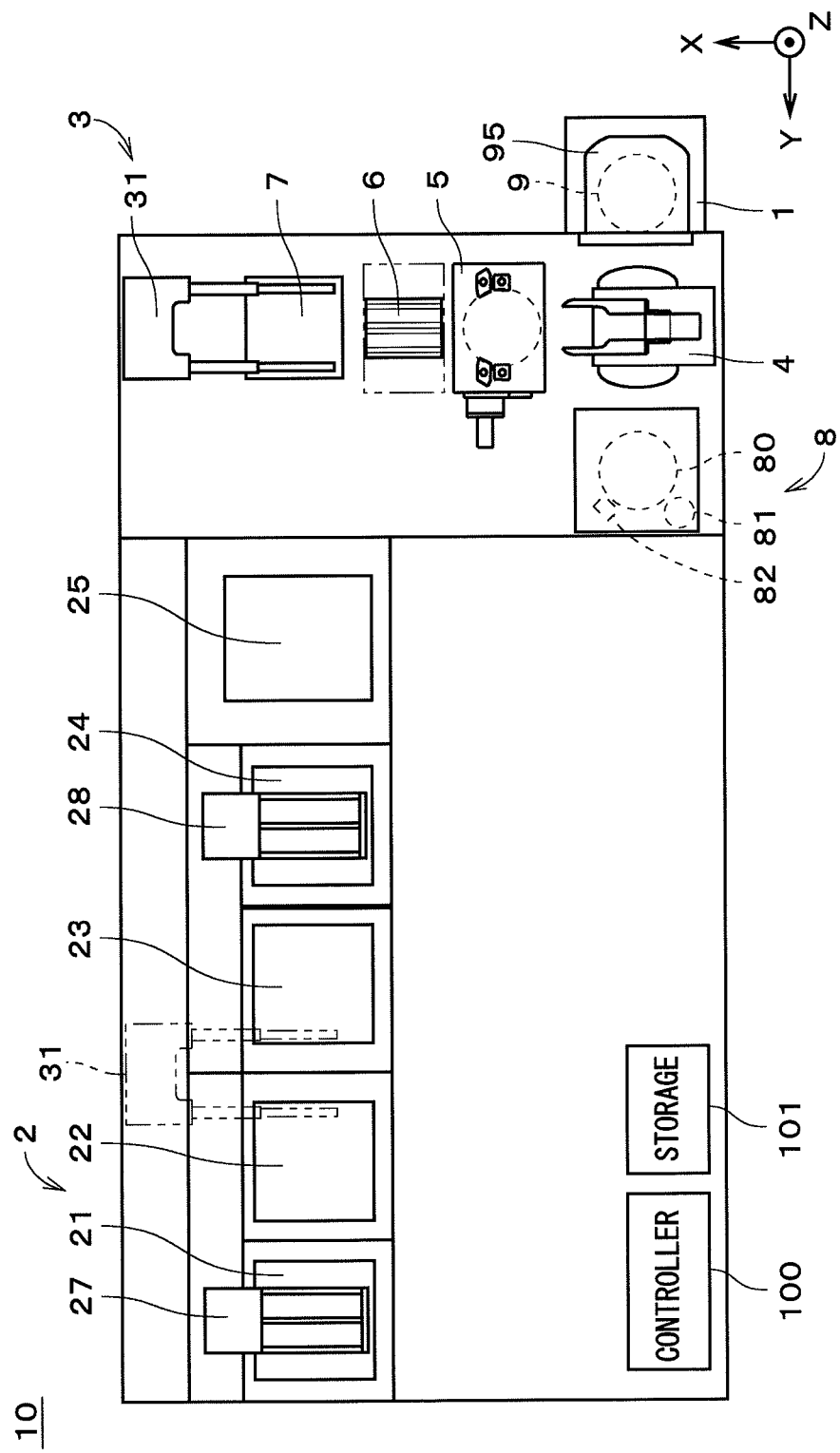
FIG. 1 is a plan view of a substrate processing apparatus according to an embodiment.

FIG. 1 is a plan view of a substrate processing apparatus 10 according to an embodiment of the present invention. The substrate processing apparatus 10 has an approximately rectangular shape in plan view. The substrate processing apparatus 10 is a batch-type substrate processing apparatus that processes a plurality of semiconductor substrates 9 (hereinafter, simply referred to as "substrates 9") by one operation. The substrates 9 are approximately disc-like substrates. Each substrate 9 has a notch 93 (see FIGS. 4 and 5) indicating a crystal orientation in a peripheral portion. The notch 93 has a depth of approximately 1 mm from the outer periphery of the substrate 9.

The substrate processing apparatus 10 includes a FOUP holder 1, a substrate processing part 2, a main transport mechanism 3, a carry-in-and-out mechanism 4, a posture changing mechanism 5, a pusher 6, a delivery mechanism 7, a substrate alignment mechanism 8, a controller 100, and a storage 101. The controller 100 controls operations or other activities of each constituent element of the substrate processing apparatus 10. The controller 100 is a general computer system that includes, for example, a CPU that performs various types of computations, a ROM that stores basic programs, and a RAM that stores various types of information. The FOUP holder 1 is disposed at one corner of the substrate processing apparatus 10. The FOUP holder 1 holds a FOUP 95. The FOUP 95 is a container that houses a plurality of (e.g., 25) substrates 9 in a horizontal posture, with the substrates 9 being stacked in the Z direction.

The Z direction in FIG. 1 is a direction parallel to the direction of gravity, and is also referred to as an "up-down direction." The X direction in FIG. 1 is a direction perpendicular to the Z direction. The Y direction is a direction perpendicular to the X and Y directions. A horizontal posture of the substrates 9 refers to a posture in which the direction of the normal to the main surfaces of the substrates 9 points approximately in the Z direction. A vertical posture of the substrates 9, which will be described later, refers to a posture in which the direction of the normal to the main surfaces of the substrates 9 points in a direction approximately perpendicular to the Z direction. In the substrate processing apparatus 10, a plurality of substrates 9 are stacked in either a horizontal or vertical posture in a direction approximately perpendicular to the main surfaces of the substrates 9. In other words, a plurality of substrates 9 in a horizontal or vertical posture are aligned in the thickness direction of the substrates 9.

Figure 2:
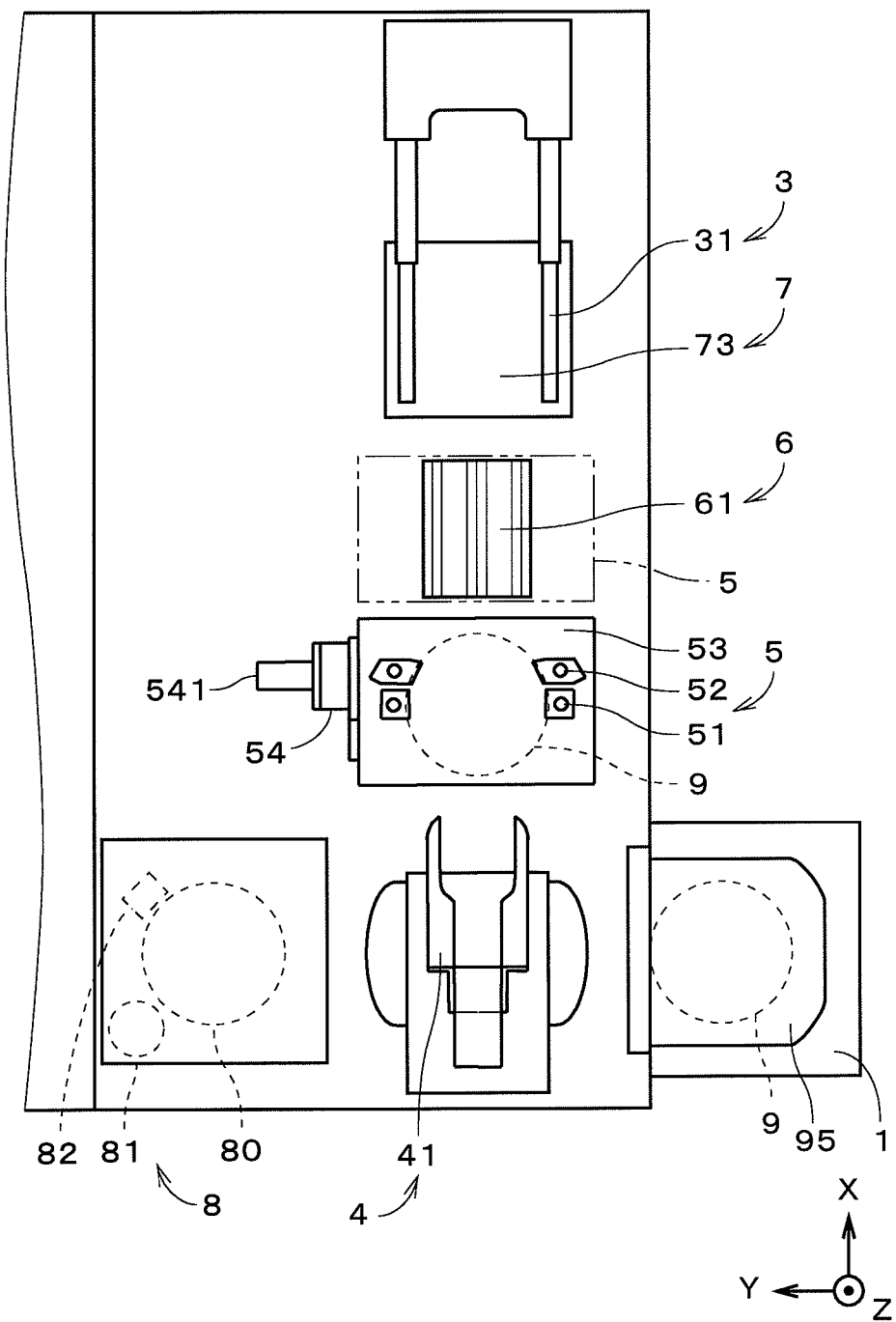
FIG. 2 is a plan view of part of the substrate processing apparatus.
Figure 3:
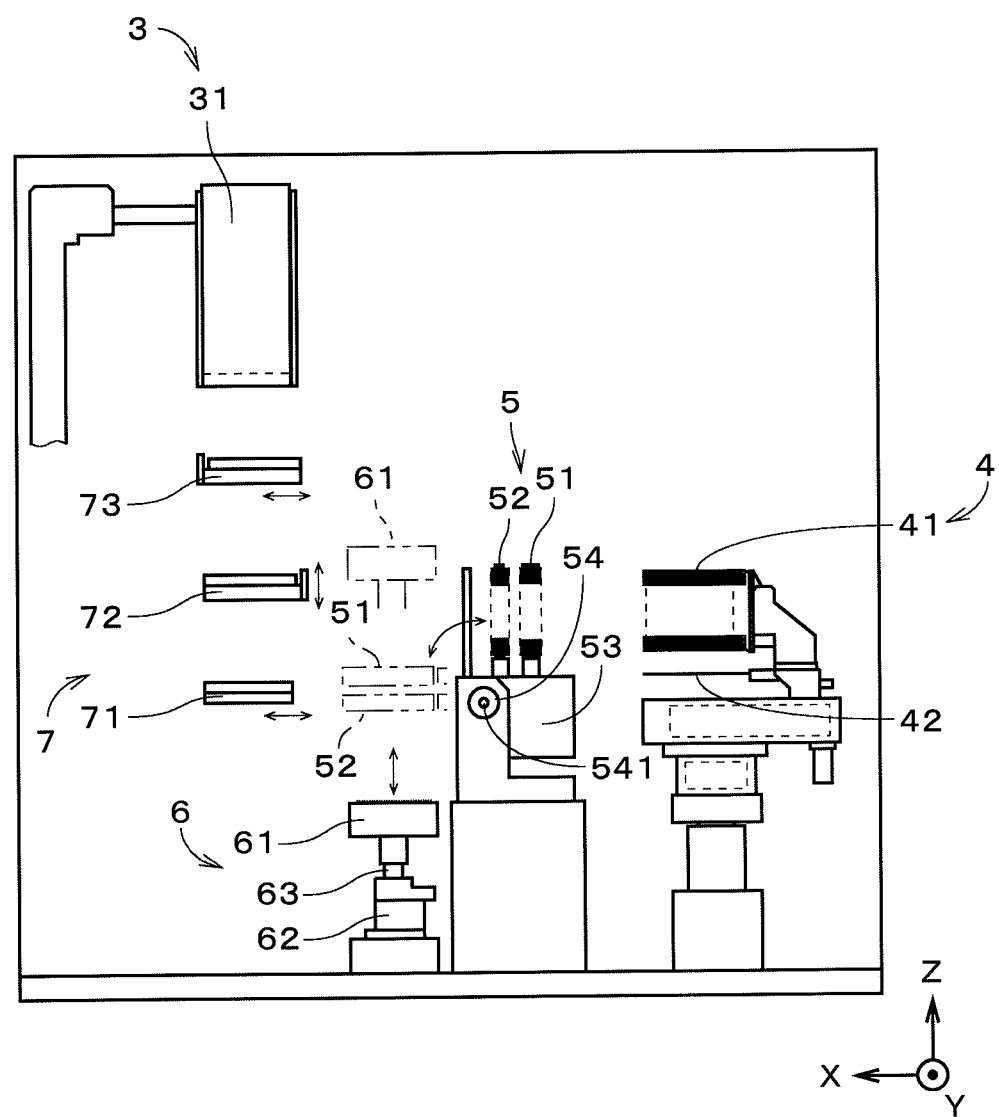
FIG. 3 is a side view of part of the substrate processing apparatus.

FIG. 2 is an enlarged plan view of a portion on the −Y side of the substrate processing apparatus 10. FIG. 3 is a side view of the portion on the −Y side of the substrate processing apparatus 10. In the substrate processing apparatus 10, the carry-in-and-out mechanism 4 is disposed on the +Y side of the FOUP holder 1 and opposes the FOUP holder 1 in the Y direction as illustrated in FIG. 2. The substrate alignment mechanism 8 is disposed on the +Y side of the carry-in-and-out mechanism 4. The FOUP holder 1 and the substrate alignment mechanism 8 are not shown in FIG. 3.

As illustrated in FIGS. 2 and 3, the posture changing mechanism 5 is disposed on the +X side of the carry-in-and-out mechanism 4. The pusher 6 is disposed on the +X side of the posture changing mechanism 5. The delivery mechanism 7 and the main transport mechanism 3 are disposed on the +X side of the pusher 6. In the state illustrated in FIG. 3, the main transport mechanism 3 is located on the +Z side of (i.e., above) the delivery mechanism 7. The substrate processing part 2 is disposed on the +Y side of the main transport mechanism 3 as illustrated in FIG. 1.

The substrate processing part 2 includes a first liquid chemical tank 21, a first rinsing liquid tank 22, a second liquid chemical tank 23, a second rinsing liquid tank 24, a dry processing part 25, a first lifter 27, and a second lifter 28. The first liquid chemical tank 21, the first rinsing liquid tank 22, the second liquid chemical tank 23, the second rinsing liquid tank 24, and the dry processing part 25 are aligned in the Y direction from the +Y side to the −Y side in the specified order. The first liquid chemical tank 21 and the second liquid chemical tank 23 retain liquid chemicals of the same type or different types. The first rinsing liquid tank 22 and the second rinsing liquid tank 24 each retain a rinsing liquid (e.g., deionized water).

When the substrate processing apparatus 10 processes substrates 9, a FOUP 95 that houses a plurality of (e.g., 25) substrates 9 in a horizontal posture is first prepared. Then, one of the plurality of (e.g., 25) substrates housed in the FOUP 95 is held by a single-substrate hand 42 of the carry-in-and-out mechanism 4 illustrated in FIGS. 2 and 3 and carried out of the FOUP 95. The single-substrate hand 42 holds a single substrate 9 in a horizontal posture. The carry-in-and-out mechanism 4 also includes a batch hand 41 that collectively holds a plurality of substrates 9 that are arranged in the Z direction in a horizontal posture.

Then, the single-substrate hand 42 rotates horizontally and moves ahead toward the substrate alignment mechanism 8 so that the single substrate 9 is transferred from the carry-in-and-out mechanism 4 to the substrate alignment mechanism 8. The substrate alignment mechanism 8 rotates the substrate 9 in the circumferential direction to change the circumferential orientation of the substrate 9 and determine the circumferential position of the substrate 9.

The substrate alignment mechanism 8 includes a substrate supporter 80, a motor 81, and a sensor 82. The substrate supporter 80 rotatably supports a substrate 9 in a horizontal posture. The motor 81 is a rotor that rotates a substrate 9 along with the substrate supporter 80. The sensor 82 acquires the angular position of a rotating substrate 9 (i.e., circumferential orientation of the substrate 9) by optically detecting the notch 93 of the substrate 9 supported by the substrate supporter 80. In the substrate alignment mechanism 8, the motor 81 rotates the substrate 9 supported by the substrate supporter 80 in the circumferential direction to change the circumferential orientation of the substrate 9. Then, the sensor 82 detects the notch 93 of the rotating substrate 9, and the motor 81 is stopped with predetermined timing after the detection (i.e., after the elapse of a predetermined period of time since the detection of the notch 93). Note that the predetermined period of time may be zero. In this way, the rotation of the substrate 9 is stopped when the notch 93 of the substrate 9 is located at a predetermined position. That is, the notch 93 of the substrate 9 is aligned in the circumferential direction. The substrate alignment mechanism 8 is a notch-position changing mechanism for changing the circumferential position of the notch 93 of the substrate 9.

When the substrate alignment mechanism 8 has determined the circumferential position of the substrate 9, the substrate 9 is carried out of the substrate alignment mechanism 8 by the single-substrate hand 42 and returned to the FOUP 95 on the FOUP holder 1. Subsequently, in the same manner, the next substrate 9 is taken out of the FOUP 95, and then returned to the FOUP 95 after the substrate alignment mechanism 8 has determined the circumferential position of the substrate 9 (i.e., the notch 93 is aligned in the circumferential direction). By repeating this operation for all of the substrates 9 in the FOUP 95, the circumferential orientations of the substrates 9 in the FOUP 95 are changed, and the circumferential positions of the substrates 9 are determined. In other words, these substrates 9 are aligned in the circumferential direction.

In the operation of determining the circumferential positions of the substrates 9, the notches 93 of all of the substrates 9 housed in the FOUP 95 may be located at the same circumferential position, or may be located at different circumferential positions. For example, the circumferential position of the notch 93 of each odd-numbered substrate 9 in the arrangement direction of the substrates 9 may be set to a first predetermined position, and the circumferential position of the notch 93 of each even-numbered substrate 9 in the arrangement direction may be set to a second predetermined position different from the first predetermined position.

When the substrate alignment mechanism 8 has completed the alignment of the substrates 9 (i.e., alignment in the circumferential direction of the notches 93), the substrates 9 are transported out of the FOUP 95 by the batch hand 41 of the carry-in-and-out mechanism 4. The batch hand 41 then rotates horizontally and moves ahead toward the posture changing mechanism 5 so that the substrates 9 are transferred from the carry-in-and-out mechanism 4 to the posture changing mechanism 5. The posture changing mechanism 5 collectively holds the plurality of substrates 9, which are stacked in the Z direction in a horizontal posture, with a horizontal holder 51. The posture changing mechanism 5 causes a holder rotation mechanism 54 to rotate the plurality of substrates 9 by 90 degrees in the counterclockwise direction in FIG. 3 about a rotational shaft 541 pointing in the Y direction, along with the horizontal holder 51, a vertical holder 52, and a mounting block 53. This rotation changes the posture of the substrates 9 at once from horizontal to vertical. The substrates 9 in a vertical posture are collectively held by the vertical holder 52.

Then, an up-and-down holder 61 is moved upward by driving a holder elevating mechanism 62 of the pusher 6, and receives and holds the substrates 9 from the vertical holder 52 indicated by the dashed double-dotted line in FIG. 3. That is, the substrates 9 held in a vertical posture are transferred between the vertical holder 52 and the pusher 6. The up-and-down holder 61 collectively holds the substrates 9 that are arranged (i.e., stacked) approximately in the X direction in a vertical posture. When the horizontal holder 51 and the vertical holder 52 of the posture changing mechanism 5 are rotated by 90 degrees in the clockwise direction in FIG. 3 and retracted from above the holder elevating mechanism 62, the up-and-down holder 61 is rotated horizontally by 180 degrees about a rotational shaft 63 pointing in the Z direction and then moved down by the holder elevating mechanism 62. Accordingly, the positions in the stacking direction of the substrates 9 are shifted by a half of the pitch of the substrates 9 (i.e., a half of the distance in the stacking direction between two adjacent substrates 9, which is hereinafter referred to as a "half pitch") from the positions before the rotation.

Thereafter, in the same procedure as described above, a new plurality of (e.g., 25) substrates 9 housed in the FOUP 95 are sequentially aligned in the circumferential direction by the substrate alignment mechanism 8 and then transferred from the carry-in-and-out mechanism 4 to the posture changing mechanism 5. The posture changing mechanism 5 collectively changes the posture of the new substrates 9 from horizontal to vertical. Then, the up-and-down holder 61 of the pusher 6 is again moved upward and receives and holds the new substrates 9 from the posture changing mechanism 5. At this time, the substrates 9 already held by the up-and-down holder 61 (hereinafter, referred to as a "first substrate group") are inserted among the new substrates 9 (hereinafter, referred to as a "second substrate group") from the underside. In this way, the posture changing mechanism 5 and the pusher 6 carry out batch assembly in which the first and second substrate groups are combined into a batch.

As described above, the substrates 9 (hereinafter, also referred to as "first substrates 9") in the first substrate group are rotated by 180 degrees (i.e., turned around) before their insertion into the second substrate group. Thus, each of the first substrates 9 in the first substrate group is disposed between each pair of the substrates 9 (hereinafter, also referred to as "second substrates 9") in the second substrate group, with the first substrates 9 and second substrates 9 alternately arranged front-to-front and back-to-back. In other words, each pair of adjacent substrates 9 among the plurality of (e.g., 50) substrates 9 held by the up-and-down holder 61 are disposed such that their front surfaces or their rear surfaces face each other (i.e., they are in a face-to-face situation). The front surfaces of the substrates 9 may be main surfaces where circuit patterns are formed, and the rear surfaces of the substrates 9 may be main surfaces on the side opposite to the front surfaces.

Alternatively, when the up-and-down holder 61 that holds the first substrate group is only moved horizontally by the half pitch in the direction of arrangement of the substrates 9 without being rotated by 180 degrees before receipt of the second substrate group, the pusher 6 may carry out batch assembly in a state in which each pair of adjacent substrates 9 is disposed such that their front and rear surfaces face each other (i.e., they are in a face-to-back situation).

The substrates 9 assembled into a batch on the up-and-down holder 61 are transferred from the up-and-down holder 61 to a carry-in chuck 71 of the delivery mechanism 7. The carry-in chuck 71 moves in the +X direction from above the holder elevating mechanism 62 while holding the received substrates 9 in a vertical posture. Subsequently, an intermediate chuck 72 of the delivery mechanism 7 moves downward to receive the substrates 9 from the carry-in chuck 71, and then moves upward. Then, a substrate chuck 31 of the main transport mechanism 3 receives the substrates 9 from the intermediate chuck 72. The substrate chuck 31 holds the substrates 9 that are arranged in the X direction in a vertical posture.

The main transport mechanism 3 transports the unprocessed substrates 9 held by the substrate chuck 31 in the +Y direction and positions the substrates 9 above the first lifter 27 of the substrate processing part 2 illustrated in FIG. 1. The first lifter 27 collectively receives the substrates 9, which are arranged in the X direction in a vertical posture, from the substrate chuck 31. The first lifter 27 moves the substrates 9 down into the first liquid chemical tank 21 and collectively immerses the substrates 9 in the liquid chemical retained in the first liquid chemical tank 21. Immersing the substrates 9 in the liquid chemical for a predetermined period of time completes liquid chemical processing performed on the substrates 9.

The first lifter 27 then pulls the substrates 9 up out of the first liquid chemical tank 21 and moves in the −Y direction. The first lifter 27 moves the substrates 9 down into the first rinsing liquid tank 22 and collectively immerses the substrates 9 in the rinsing liquid retained in the first rinsing liquid tank 22. Immersing the substrates 9 in the rinsing liquid for a predetermined period of time completes rinsing processing performed on the substrates 9. After the rinsing processing has completed, the first lifter 27 pulls the substrates 9 up out of the first rinsing liquid tank 22. The substrate chuck 31 of the main transport mechanism 3 collectively receives the substrates 9 from the first lifter 27 and moves to above the second lifter 28.

Like the first lifter 27, the second lifter 28 collectively receives the substrates 9 from the substrate chuck 31 and collectively immerses the substrates 9 in the liquid chemical retained in the second liquid chemical tank 23. After the liquid chemical processing performed on the substrates 9 has completed, the second lifter 28 pulls the substrates 9 up out of the second liquid chemical tank 23 and collectively immerses the substrates 9 in the rinsing liquid retained in the second rinsing liquid tank 24. After the rinsing processing performed on the substrates 9 has completed, the second lifter 28 pulls the substrates 9 up out of the second rinsing liquid tank 24. The substrate chuck 31 of the main transport mechanism 3 collectively receives the substrates 9 from the second lifter 28 and moves to above the dry processing part 25.

The dry processing part 25 collectively receives the substrates 9 from the substrate chuck 31 and performs dry processing on the substrates 9 at once. The dry processing involves, for example, supplying an organic solvent (i.e., isopropyl alcohol) to the substrates 9 in a reduced-pressure atmosphere and rotating the substrates 9 to remove the liquids on the substrates 9 by centrifugal force. After the dry processing performed on the substrates 9 has completed, the substrate chuck 31 of the main transport mechanism 3 collectively receives the processed substrates 9 from the dry processing part 25 and moves in the −Y direction.

Then, a delivery chuck 73 of the delivery mechanism 7 illustrated in FIGS. 2 and 3 collectively receives the substrates 9 from the substrate chuck 31 of the main transport mechanism 3 and moves in the −X direction to position the substrates 9 above the up-and-down holder 61 of the pusher 6. The up-and-down holder 61 of the pusher 6 moves upward and receives the substrates 9 from the delivery chuck 73. The up-and-down holder 61 holds the plurality of (e.g., 50) substrates 9 arranged in the X direction in a vertical posture.

Next, the up-and-down holder 61 moves downward to transfer the substrates 9 in a vertical posture between the pusher 6 and the vertical holder 52. More specifically, among the substrates 9, the plurality of (e.g., 25) substrates 9 in the second substrate group are transferred to the vertical holder 52 indicated by the dashed double-dotted line in FIG. 3. In other words, the batch of the first substrate group and the second substrate group is disassembled, and the first substrate group and the second substrate group are separated from each other. The horizontal holder 51 and the vertical holder 52 of the posture changing mechanism 5 are rotated by 90 degrees in the clockwise direction in FIG. 3. This rotation changes the posture of the substrates 9 in the second substrate group at once from vertical to horizontal. These substrates 9 are collectively held by the horizontal holder 51 while being stacked in the Z direction in a horizontal posture. Then, the batch hand 41 of the carry-in-and-out mechanism 4 receives the substrates 9 from the horizontal holder 51 and carries the substrates 9 into the FOUP 95. The FOUP 95 into which the processed substrates 9 have been carried is replaced with a new FOUP 95.

When the posture changing mechanism 5 has changed the posture of the substrates 9 in the second substrate group from vertical to horizontal as described above, the up-and-down holder 61 that holds the plurality of (e.g., 25) substrates 9 in the first substrate group is moved upward. The horizontal holder 51 and the vertical holder 52 that have transferred the substrates 9 in the second substrate group to the carry-in-and-out mechanism 4 are rotated by 90 degrees in the counterclockwise direction in FIG. 3.

Then, the up-and-down holder 61 is again moved downward to transfer the substrates 9 in a vertical posture between the pusher 6 and the vertical holder 52. More specifically, the substrates 9 in the first substrate group are transferred to the vertical holder 52 indicated by the dashed double-dotted line in FIG. 3. The horizontal holder 51 and the vertical holder 52 are again rotated by 90 degrees in the clockwise direction in FIG. 3. This rotation changes the posture of the substrates 9 in the first substrate group at once from vertical to horizontal. These substrates 9 are collectively held by the horizontal holder 51 while being stacked in the Z direction in a horizontal posture. Then, the batch hand 41 of the carry-in-and-out mechanism 4 receives the substrates 9 from the horizontal holder 51 and carries the substrates 9 into the FOUP 95. Note that the posture changing mechanism 5 may first receive the first substrate group and then receive the second substrate group in the operation of moving the substrates 9 from the pusher 6 to the posture changing mechanism 5.

The posture changing mechanism 5 and the pusher 6 change the posture of the substrates 9 from horizontal to vertical or from vertical to horizontal as described above under the control of the controller 100. In other words, the posture changing mechanism 5, the pusher 6, and the controller 100 constitute a posture changing device that changes the posture of the substrates 9 from one of horizontal and vertical postures to the other posture.

While the substrate processing apparatus 10 illustrated in FIGS. 1 to 3 performs processing on the substrates 9 having an approximately disc-like shape as described above, these substrates 9 may be warped under the influence of processing (i.e., pre-processing) performed before transport of the substrates to the substrate processing apparatus 10. Although various types of warpage may occur in the substrates 9, a plurality of substrates 9 housed in a single FOUP 95 are generally warped in the same way. More specifically, when the positions of the notches 93 are used as a reference, the substrates 9 are in the same warped state. The warped state of the substrates 9 indicates information including the orientation of the warp in the substrates 9 (e.g., orientation in which each substrate is convex to the front surface side) and the magnitude of the warp in the substrates 9.

Figure 4:
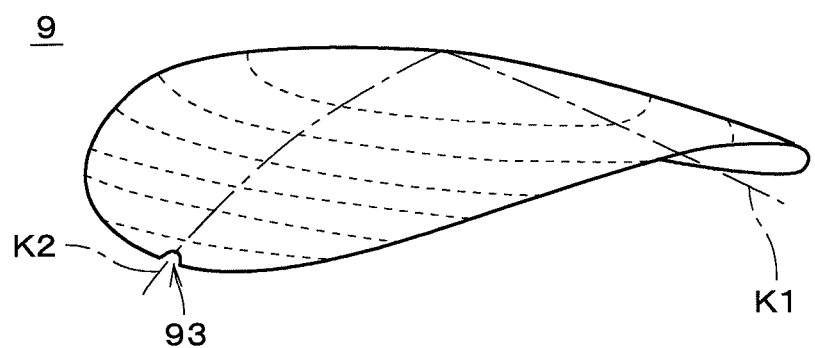
FIG. 4 is a perspective view of a substrate.
Figure 5:
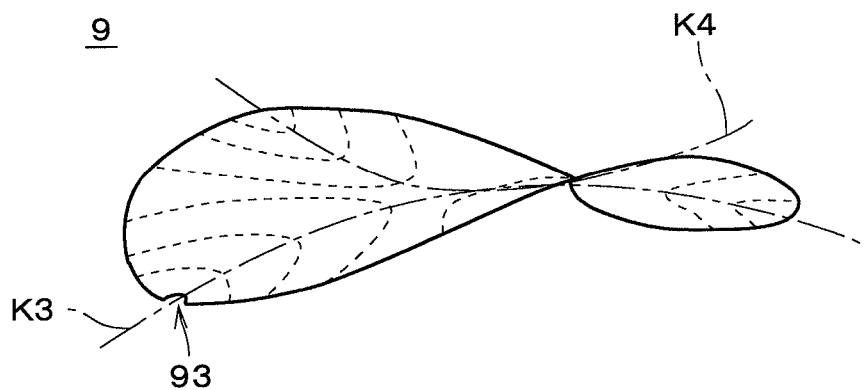
FIG. 5 is a perspective view of a substrate.

FIGS. 4 and 5 are perspective views illustrating examples of substrates 9 in different warped states. The substrate 9 in FIG. 4 is curved in a first radial direction K1 to one side in the thickness direction (i.e., direction in which the substrate is convex upward in FIG. 4) with a first curvature. The substrate 9 in FIG. 4 is also curved in a second radial direction K2 orthogonal to the first radial direction K1 to the one side in the thickness direction (i.e., the same direction as the direction of the curve in the first radial direction K1) with a second curvature greater than the first curvature.

The substrate 9 in FIG. 5 is curved in a first radial direction K3 to one side in the thickness direction (i.e., direction in which the substrate is convex upward in FIG. 5). The first radial direction K3 may be different from the first radial direction K1 illustrated in FIG. 4. The substrate 9 in FIG. 5 is also curved in a second radial direction K4 orthogonal to the first radial direction K3 to the other side in the thickness direction (i.e., direction opposite to the direction of the curve in the first radial direction K3).

In the following description, the warped states of the substrates 9 illustrated in FIGS. 4 and 5 are also respectively referred to as a "first warped state" and a "second warped state." The distance in the thickness direction between lowest and highest points in the thickness direction of each warped substrate 9 in a horizontal posture is referred to as the "size in the thickness direction" of the substrate 9. When this substrate 9 is held in a vertical posture, the size in the thickness direction of the substrate 9 is equal to the distance in the thickness direction between a point of the substrate 9 that is closest to the one side in the thickness direction and a point of the substrate 9 that is closest to the other side in the thickness direction. When the substrate 9 is flat and not warped, the size in the thickness direction of the substrate 9 is the same as the thickness of the substrate 9. The size in the thickness direction of a warped substrate 9 may be greater by approximately 0.5 mm than that of a flat substrate 9.

Next, the procedure for aligning the substrates 9 by the substrate alignment mechanism 8 will be described with reference to the flowchart in FIG. 6. In the substrate processing apparatus 10 illustrated in FIG. 1, first, "warpage-and-notch-position information" is input to and stored in the storage 101 in advance before a plurality of substrates 9 are sequentially carried into the substrate alignment mechanism 8 (step S11). The warpage-and-notch-position information includes a plurality of combinations of a warped state, which is common to a plurality of substrates 9, and a notch position at which the substrates 9 in the above warped state are held in a proper posture. The notch position refers to the position in the circumferential direction of the notch 93 of the substrate 9. For example, when each substrate 9 is held in a vertical posture, a reference notch position (i.e., 0° notch position) indicates a state in which the notch 93 is located at the topmost position. When the notch 93 is away in the circumferential direction from the reference position, the angle in the clockwise direction between the reference position and the notch 93 when the substrate 9 is viewed from the front surface side is referred to as the "notch position."

One exemplary combination of the warped state and the notch position included in the warpage-and-notch-position information is a combination of a code (e.g., numeric or symbol) that indicates the warped state of the substrate 9 illustrated in FIG. 4 or 5 and the angle that indicates the notch position. The notch position may be the position of the notch 93 at which, in a state in which the substrate 9 in the warped state illustrated in FIG. 4 or 5 is held in a vertical posture at a lower edge portion by the up-and-down holder 61, the distance in the thickness direction between the lower edge portion and an upper edge of the substrate 9 becomes a minimum (i.e., the inclination of the substrate 9 with respect to the up-down direction becomes a minimum). Alternatively, the notch position in the above combination included in the warpage-and-notch-position information may be the position of the notch 93 at which, in a state in which the substrate 9 in the warped state illustrated in FIG. 4 or 5 is held in a vertical posture at a lower edge portion by the first lifter 27 or the second lifter 28, the distance in the thickness direction between the lower edge portion and the upper edge of the substrate 9 becomes a minimum.

Figure 7:
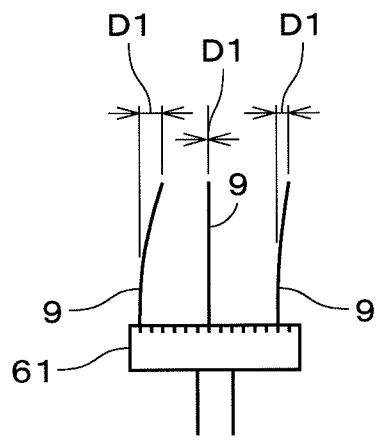
FIG. 7 illustrates substrates held in a vertical posture.

FIG. 7 is a side view illustrating a state in which the lower edge portions of substrates 9 in the warped state illustrated in FIG. 4 are held in a vertical posture by the up-and-down holder 61. In the case of the substrate 9 illustrated in FIG. 4, the notch 93 is located along the second radial direction K2. FIG. 7 illustrates an assumed case in which three substrates 9 with different notch positions are simultaneously held by the up-and-down holder 61. The leftmost substrate 9 in FIG. 7 shows a state in which the notch 93 is located at the reference position (i.e., 0° notch position). The substrate 9 in the center in FIG. 7 shows a state in which the notch is located at a 45° notch position. The rightmost substrate 9 in FIG. 7 shows a state in which the notch is located at a 90° notch position.

In the example illustrated in FIG. 7, when the notch is located at the 45° notch position, the substrate 9 in a vertical posture is held approximately parallel to the up-down direction (i.e., Z direction), and a distance D1 in the thickness direction between the lower edge portion and upper edge of the held substrate 9 is the smallest. When the notch is located at the 90° notch position, the distance D1 is the next smallest after that in the case where the notch is located at the 45° notch position. When the notch is located at the 0° notch position, the distance D1 is the largest. The warpage-and-notch-position information includes, for example, a combination of the 45° notch position and a code that indicates the warped state of the substrate 9 illustrated in FIG. 4. Note that the notch position in the combination that is included in the warpage-and-notch-position information does not necessarily have to be the position of the notch 93 at which the distance D1 becomes the smallest, and may be any position at which the distance D1 becomes smaller than when the notch 93 is located at any other position. Thus, the warpage-and-notch-position information may include a combination of the 90° notch position and the code indicating the warped state of the substrate 9 illustrated in FIG. 4.

In the substrate processing apparatus 10 illustrated in FIG. 1, after step S11, the warped state that is common to a plurality of substrates 9 carried into the substrate processing apparatus 10 is input to and stored in the storage 101 as input information about the warped state. This input information may be a code that indicates the warped state of a plurality of substrates 9.

Next, the controller 100 (see FIG. 1) controls the single-substrate hand 42 of the carry-in-and-out mechanism 4 as described above, so that a first substrate 9 housed in the FOUP 95 on the FOUP holder 1 is carried into the substrate alignment mechanism 8, and the substrate alignment mechanism 8 starts rotating the substrate 9 (step S12). Then, the controller 100 controls the motor 81 on the basis of the position of the notch 93 detected by the sensor 82, the above input information, and the warpage-and-notch-position information. Thus, the circumferential position of the notch 93 of the substrate 9 is changed and set to a desired position.

More specifically, the controller 100 extracts a notch position that corresponds to the warped state of the substrate 9 indicated by the input information, from the aforementioned plurality of combinations included in the warpage-and-notch-position information. Then, the substrate 9 is rotated until the position of the notch 93 of the substrate 9 matches the extracted notch position. When the position of the notch 93 has matched the extracted notch position, the rotation of the substrate 9 is stopped, and the circumferential position of the notch 93 of the substrate 9 is determined (step S13). The substrate 9 for which the position of the notch 93 has been determined is returned to the FOUP 95 on the FOUP holder 1 by the single-substrate hand 42. By repeating the aforementioned processing in steps S12 and S13 for all of the substrates 9 housed in the FOUP 95 on the FOUP holder 1, all of the substrates 9 housed in the FOUP 95 are sequentially aligned, with the position of the notch 93 of each substrate 9 having matched the notch position extracted by the controller 100. In the substrate processing apparatus 10, the substrate alignment mechanism 8, the storage 101, and the controller 100 serve as a substrate alignment apparatus for aligning a plurality of substrates 9, each having a notch 93 in the peripheral portion. Note that the FOUP 95 and the carry-in-and-out mechanism 4 may also be regarded as part of the substrate alignment apparatus.

The plurality of substrates 9 aligned by the substrate alignment apparatus are transferred in a horizontal posture to the carry-in-and-out mechanism 4 illustrated in FIG. 1. The substrates 9 are transferred from the carry-in-and-out mechanism 4 to the posture changing mechanism 5. The posture changing mechanism 5 changes the posture of the substrates 9 at once from horizontal to vertical as described above. Then, the substrates 9 in a vertical posture are transferred from the posture changing mechanism 5 to the pusher 6 and held by the up-and-down holder 61 of the pusher 6. The posture changing mechanism 5 and the pusher 6 carry out batch assembly as described above, in which the up-and-down holder 61 that holds the first substrate group receives the second substrate group held by the posture changing mechanism 5.

Figure 8:
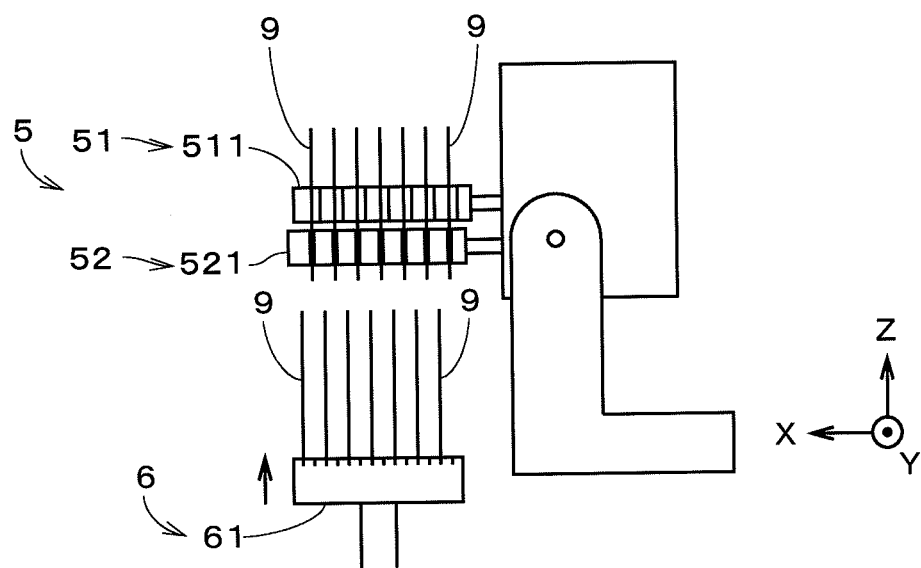
FIG. 8 is a side view illustrating movement of a posture changing mechanism and a pusher.
Figure 9:
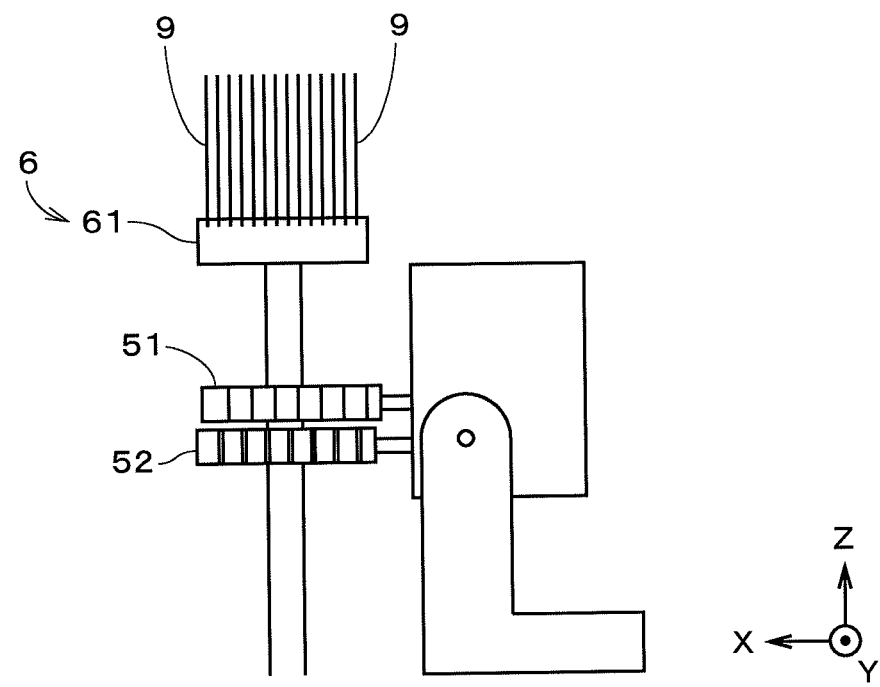
FIG. 9 is a side view illustrating the movement of the posture changing mechanism and the pusher.

FIGS. 8 and 9 are side views illustrating the movement of the posture changing mechanism 5 and the pusher 6 during batch assembly. In order to facilitate understanding of the drawings, the number of substrates 9 illustrated in FIGS. 8 and 9 is smaller than the actual number. In the state illustrated in FIG. 8, the plurality of substrates 9 (i.e., the first substrates 9 in the first substrate group) that have already been transferred from the posture changing mechanism 5 to the pusher 6 are held in a vertical posture by the up-and-down holder 61 that is a substrate holder. Moreover, another plurality of substrates 9 (i.e., the second substrates 9 in the second substrate group) are held in a vertical posture by the vertical holder 52 that is another substrate holder. The first substrates 9 and the second substrates 9 are already aligned by the aforementioned substrate alignment apparatus before being held by the posture changing mechanism 5 and the pusher 6.

In the substrate processing apparatus 10, the controller 100 (see FIG. 1) controls the holder elevating mechanism 62 (see FIG. 3) so as to move the up-and-down holder 61 upward. The up-and-down holder 61 receives the substrates 9 in a vertical posture from the vertical holder 52 and holds the substrates 9 as illustrated in FIG. 9 while moving upward through the space between the pair of vertical support members 521 of the vertical holder 52 and between the pair of horizontal support members 511 of the horizontal holder 51. This completes the aforementioned batch assembly, and the first and second substrate groups are held by the up-and-down holder 61 of the pusher 6. During batch assembly, the first substrate group is inserted from the underside among the second substrate group, and each of the first substrates 9 in the first substrate group is disposed between each pair of the second substrates 9 in the second substrate group. In the substrate processing apparatus 10, the holder elevating mechanism 62 that moves the up-and-down holder 61 upward serves as a substrate arrangement mechanism for arranging each of the first substrates 9 among the second substrates 9. The substrate alignment apparatus, the up-and-down holder 61, and the holder elevating mechanism 62 described above serve as a substrate arrangement apparatus for arranging a plurality of substrates 9.

As described previously, the first substrates 9 held by the up-and-down holder 61 are aligned in advance by the aforementioned substrate alignment apparatus so as to reduce the distance D1 (see FIG. 7) in the thickness direction between the lower edge portion and upper edge of each substrate 9. This alignment prevents or suppresses the contact of the first substrates 9 with the second substrates 9 held by the vertical holder 52 during batch assembly. This alignment also prevents or suppresses the contact of the first substrates 9 with the vertical holder 52 and the horizontal holder 51.

The second substrates 9 held by the vertical holder 52 are also aligned in advance by the substrate alignment apparatus so as to reduce the distance D1 in the thickness direction between the lower edge portion and upper edge of each substrate 9. This alignment more suitably prevents or further suppresses the contact between the first substrates 9 and the second substrates 9 during batch assembly. Note that, if it is possible to prevent or suppress the contact between the first substrates 9 and the second substrates 9, the second substrates 9 may be held by the posture changing mechanism 5 without being aligned by the substrate alignment apparatus.

The plurality of substrates 9 (i.e., the first and second substrate group) assembled into a batch by the above-described substrate arrangement apparatus are transported via the delivery mechanism 7 and the main transport mechanism 3 illustrated in FIG. 1 to the substrate processing part 2. In the substrate processing part 2, as described above, the substrates 9 held in a vertical posture by the first lifter 27 are immersed in the liquid chemical that is a processing liquid retained in the first liquid chemical tank 21, and are also immersed in a rinsing liquid that is a processing liquid retained in the first rinsing-liquid tank 22. Also, the substrates 9 held in a vertical posture by the second lifter 28 are immersed in the liquid chemical that is a processing liquid retained in the second liquid chemical tank 23, and are also immersed in the rinsing liquid that is a processing liquid retained in the second rinsing-liquid tank 24.

In the substrate processing apparatus 10, the first lifter 27 and the second lifter 28 serve as substrate holders that hold a plurality of substrates 9 aligned by the aforementioned substrate alignment apparatus in a vertical posture. The first liquid chemical tank 21, the first rinsing-liquid tank 22, the second liquid chemical tank 23, and the second rinsing-liquid tank 24 serve as liquid processing parts that retain processing liquids in which the substrates 9 held by the substrate holder (i.e., the first lifter 27 or the second lifter 28) are to be immersed.

As described above, the substrates 9 held by the first lifter 27 are aligned in advance by the substrate alignment apparatus so as to reduce the distance D1 (see FIG. 7) in the thickness direction between the lower edge portion and upper edge of each substrate 9. Thus, it is possible to make the conditions in the first liquid chemical tank 21 and the first rinsing-liquid tank 22, such as the amounts of processing liquids between adjacent substrates 9 and the flows of processing liquids between adjacent substrates 9, close to the conditions in the case where each substrate 9 is not warped. In other words, it is possible to make the conditions of processing in the first liquid chemical tank 21 and the first rinsing-liquid tank 22 close to the design conditions of processing. As a result, the substrates 9 are suitably processed with the processing liquids in the first liquid chemical tank 21 and the first rinsing-liquid tank 22.

The substrates 9 held by the second lifter 28 are also aligned in advance by the aforementioned substrate alignment apparatus. Thus, it is possible to make the conditions in the second liquid chemical tank 23 and the second rinsing-liquid tank 24, such as the amounts of processing liquids between adjacent substrates and the flows of processing liquids between adjacent substrates 9, close to the conditions in the case where each substrate 9 is not warped. In other words, it is possible to make the conditions of processing in the second liquid chemical tank 23 and the second rinsing-liquid tank 24 close to the design conditions of processing. As a result, the substrates 9 are suitably processed with the processing liquids in the second liquid chemical tank 23 and the second rinsing-liquid tank 24.

As described above, the aforementioned substrate alignment apparatus includes the motor 81, the storage 101, and the controller 100. The motor 81 is a rotor that sequentially rotates a plurality of substrates 9 in a circumferential direction, the substrates 9 being to be held in a vertical posture at their lower edge portions by the substrate holder (e.g., the up-and-down holder 61, the first lifter 27, or the second lifter 28). The storage 101 stores the warpage-and-notch-position information that includes a plurality of combinations of the warped state of a plurality of substrates 9 and the notch position at which each substrate 9 in this warped state is held in a proper posture by the above substrate holder. The controller 100 controls the motor 81.

The controller 100 controls the motor 81 on the basis of the warpage-and-notch-position information and input information that is input about the ward state of a plurality of substrates 9, so as to sequentially rotate the substrates 9 in the circumferential direction to determine the circumferential positions of the notches 93 of the substrates 9. This reduces the distance D1 in the thickness direction between the lower edge portion and upper edge of each substrate 9 that is held by the above substrate holder. In other words, the inclination of each substrate 9 held by the substrate holder is reduced. As a result, it is possible to facilitate handling of a plurality of substrates 9 held by the substrate holder (e.g., holding, transport, and delivery of the substrates 9 or processing of the substrates 9 using processing liquids).

As described above, the substrate processing apparatus 10 includes the above-described substrate alignment apparatus, the substrate holder (e.g., the first lifter 27 or the second lifter 28), and the liquid processing part (e.g., the first liquid chemical tank 21, the first rinsing-liquid tank 22, the second liquid chemical tank 23, or the second rinsing-liquid tank 24). The substrate holder holds a plurality of substrates 9 that are aligned by the substrate alignment apparatus. The liquid processing part retains a processing liquid in which a plurality of substrates 9 held by the substrate holder are to be immersed. With the substrate processing apparatus 10, since the above-described distance D1 of each substrate 9 held by the substrate holder can be reduced (i.e., the inclination of each substrate 9 can be reduced), it is possible to make the conditions, such as the amounts of processing liquids between adjacent substrates 9 and the flows of processing liquids between adjacent substrates 9, close to the conditions in the case where each substrate 9 is not warped. As a result, the substrates 9 can be suitably processed with the processing liquids.

Figure 6:
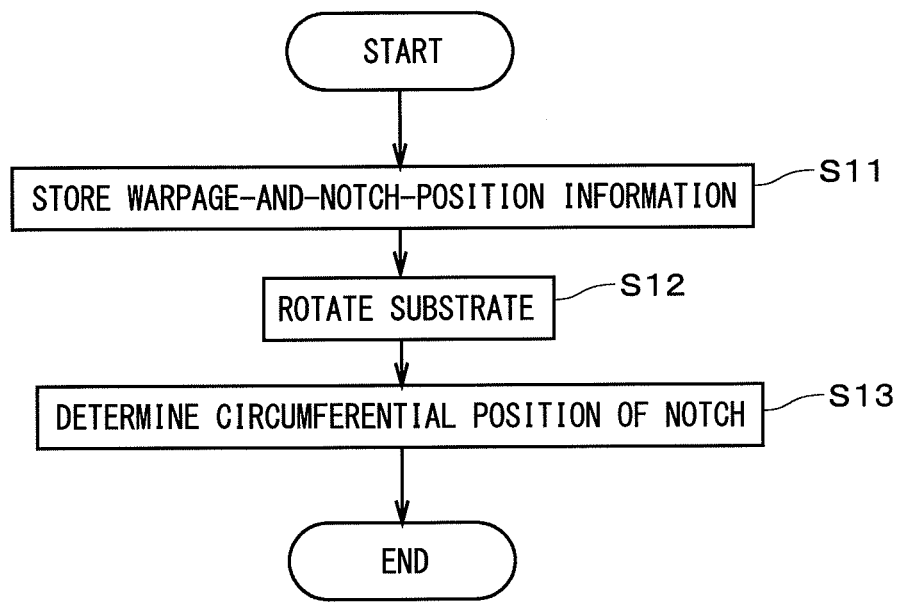
FIG. 6 is a flowchart illustrating the procedure for aligning substrates.
Figure 10:
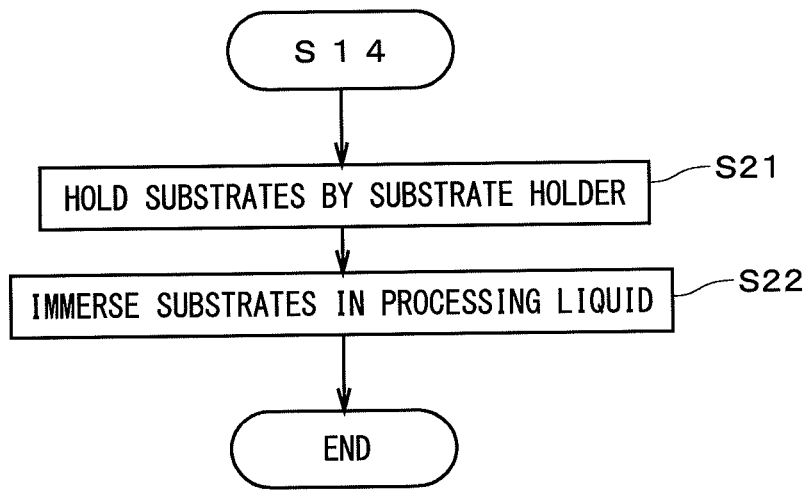
FIG. 10 is a flowchart illustrating a procedure for immersing substrates in a processing liquid.

Focusing on the immersion of the substrates 9 in the processing liquids in the procedure of processing performed on the substrates 9, steps S21 and S22 illustrated in FIG. 10 are performed after the substrates 9 are aligned by the substrate alignment method in steps S11 to S13 illustrated in FIG. 6. More specifically, the substrate holder (e.g., the first lifter 27 or the second lifter 28) holds a plurality of substrates 9 aligned by the substrate alignment method (step S21). Then, the substrates 9 held by the substrate holder are immersed in the processing liquids (step S22). This allows the substrates 9 to be suitably processed with the processing liquids as described above.

The aforementioned substrate arrangement apparatus includes the above-described substrate alignment apparatus, the up-and-down holder 61 that is the substrate holder, and the holder elevating mechanism 62 that is the substrate arrangement mechanism. The up-and-down holder 61 holds a plurality of substrates 9 aligned by the substrate alignment apparatus. The holder elevating mechanism 62 disposes each of the substrates 9 held by the up-and-down holder 61 between each pair of another plurality of substrates 9 held by the vertical holder 52 that is another substrate holder.

With the substrate arrangement apparatus, since the above-described distance D1 of each substrate 9 held by the up-and-down holder 61 can be reduced (i.e., the inclination of each substrate 9 can be reduced) as described above, it is possible to prevent or suppress the contact of the substrates 9 held by the up-and-down holder 61 with the other substrates 9 held by the vertical holder 52 during batch assembly. It is also possible to prevent or suppress the contact of the substrates 9 held by the up-and-down holder 61 with the substrate holder such as the vertical holder 52 or the horizontal holder 51 during batch assembly. As a result, a plurality of substrates 9 can be suitably assembled into a batch. The substrate arrangement apparatus that is capable of preventing or suppressing the contact between substrates 9 is in particular suitable for the case where the substrate holder holds a plurality of substrates 9 in a face-to-face situation in which adjacent substrates 9 are inclined in opposite directions.

Figure 11:
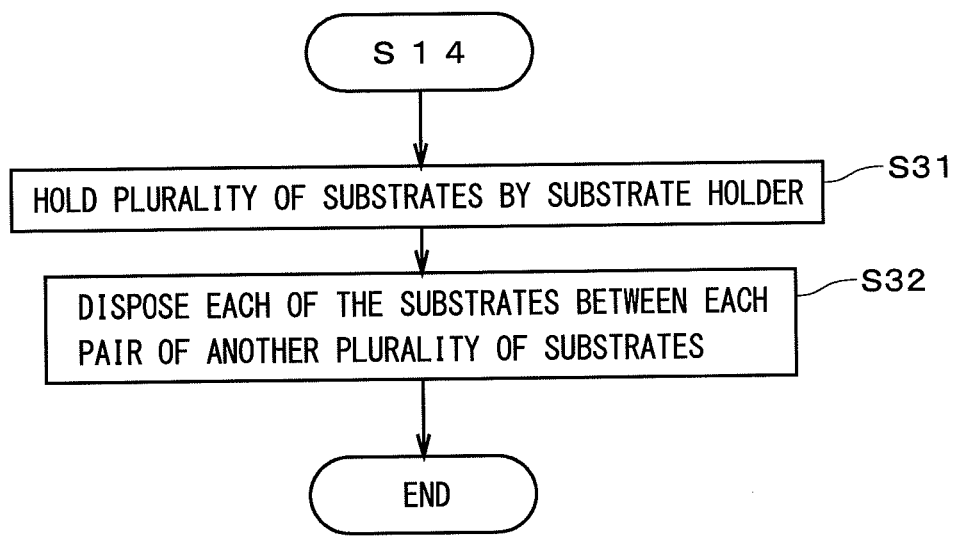
FIG. 11 is a flowchart illustrating a procedure for batch assembly.

Focusing on the operation of arranging the substrates 9 in the procedure of processing performed on the substrates 9, steps S31 and S32 illustrated in FIG. 11 are performed after a plurality of substrates 9 are aligned by the substrate alignment method in steps S11 to S13 illustrated in FIG. 6. More specifically, the up-and-down holder 61 that is the substrate holder holds a plurality of substrates 9 aligned by the substrate alignment method (step S31). Then, each of the substrates 9 held by the up-and-down holder 61 is disposed between each pair of another plurality of substrates 9 held by the vertical holder 52 that is another substrate holder (step S32). This allows the substrates 9 to be suitably assembled into a batch.

In the substrate processing apparatus 10, the aforementioned warpage-and-notch-position information stored in the storage 101 includes various combinations of the warped state and the notch position other than those described above. For example, the notch position in the above combination included in the warpage-and-notch-position information may be the position of the notch 93 at which, in a state in which the substrates 9 in the warped state illustrated in FIG. 4 or 5 are held in a horizontal posture by the batch hand 41 (see FIG. 1) that is the substrate holder, a distance in the thickness direction between the top of each substrate 9 and an area of contact of the peripheral portion of the substrate 9 with the batch hand 41 becomes the smallest.

Figure 12:
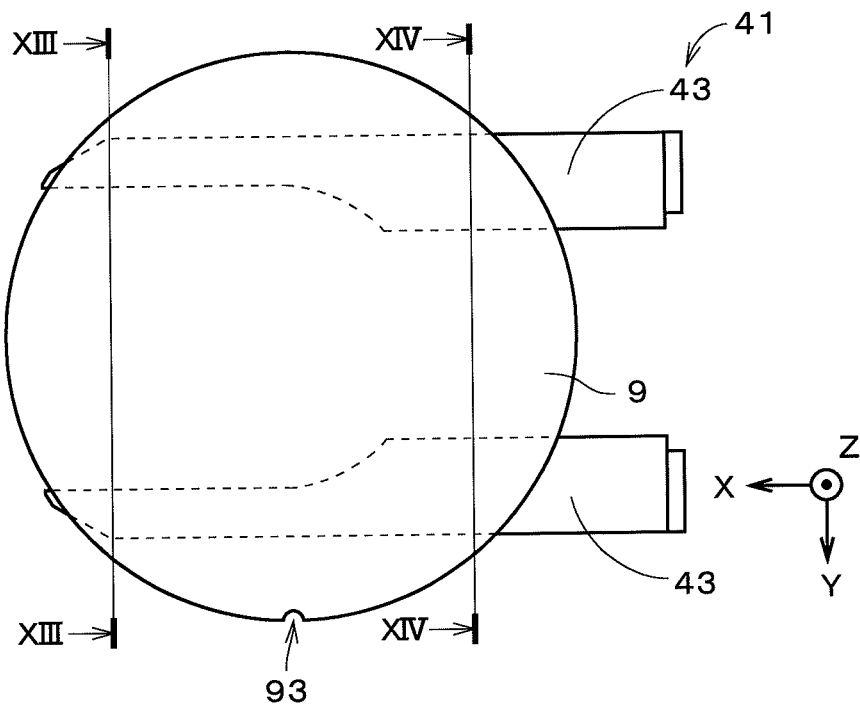
FIG. 12 is a plan view of a batch hand and a substrate.

FIG. 12 is a plan view of a substrate 9 held in a horizontal posture by the batch hand 41. FIG. 12 illustrates a single substrate 9 in a horizontal posture and two hand elements 43 of the batch hand 41 that support the lower surface of the substrate 9 from the underside. Each hand element 43 is a member that extends approximately in the X direction. More specifically, each hand element 43 is a plate-like member having a generally strip shape in plan view. The two hand elements 43 are arranged side by side in the Y direction.

When each substrate 9 is held in a horizontal posture, for example, a reference notch position (i.e., 0° notch position) indicates a state in which the notch 93 is located at a position that is furthest to the +Y side away from the two hand elements 43 as illustrated in FIG. 12. When the notch 93 is away in the circumferential direction from the reference position, the angle in the counterclockwise direction between the reference position and the notch 93 when the substrate 9 is viewed from above (i.e., the +Z side) is referred to as the "notch position."

Figure 13:
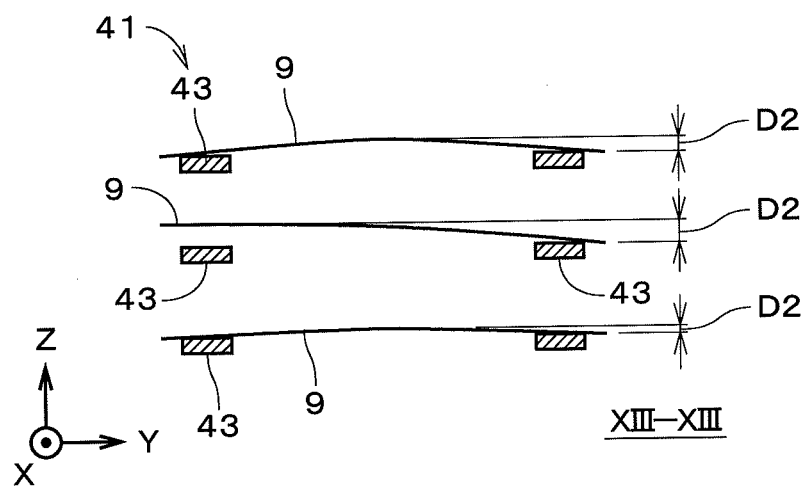
FIG. 13 is a cross-sectional view illustrating substrates held in a horizontal posture.
Figure 14:
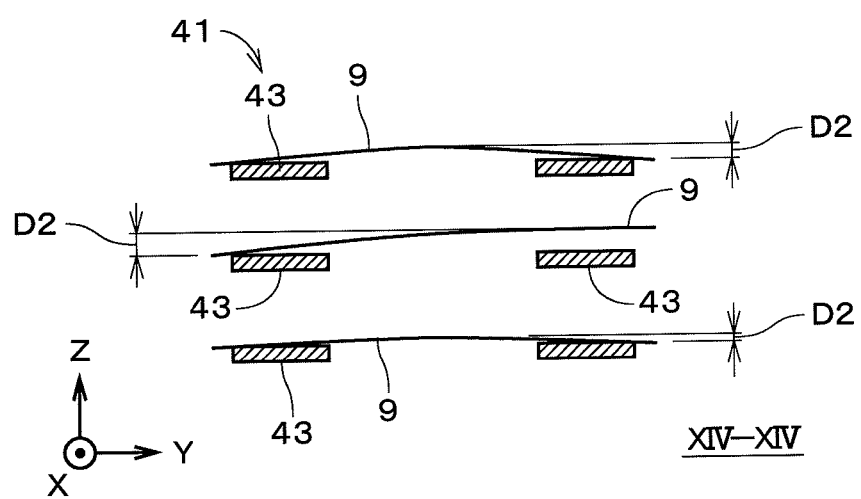
FIG. 14 is a cross-sectional view illustrating the substrates held in a horizontal posture.

FIGS. 13 and 14 are cross-sectional views illustrating a state in which substrates 9 in the warped state illustrated in FIG. 4 are supported in a horizontal posture from the underside by the batch hand 41. FIG. 13 illustrates a cross-section taken at a position along line XIII-XIII in FIG. 12, and FIG. 14 illustrates a cross-section taken at a position along line XIV-XIV in FIG. 12. FIGS. 13 and 14 illustrate an assumed case in which three substrates 9 whose notches are located at different notch positions are simultaneously held by the batch hand 41. The uppermost substrate 9 in FIGS. 13 and 14 shows a state in which the notch 93 is located at the reference position (i.e., 0° notch position). The substrate 9 in the center in FIGS. 13 and 14 shows a state in which the notch is located at a 45° notch position. The lowermost substrate 9 in FIGS. 13 and 14 shows a state in which the notch is located at a 90° notch position.

In the example illustrated in FIGS. 13 and 14, when the notch is located at the 90° notch position, a distance D2 in the thickness direction between the top of the substrate 9 in a horizontal posture and the area of contact of the peripheral portion of the substrate 9 with the batch hand 41 is the smallest. When the notch is located at the 0° notch position, the distance D2 is the next smallest after that in the case where the notch is located at the 90° notch position. When the notch is located at the 45° notch position, the distance D2 is the largest. When the notch is located at the 45° notch position, the number of areas of contact between the substrate 9 and the hand elements 43 becomes smaller than that in the case where the notch is located at the other notch positions. Thus, the substrates 9 cannot easily be held stably during, for example, transport by the carry-in-and-out mechanism 4.

The warpage-and-notch-position information includes, for example, a combination of the 90° notch position and a code that indicates the warped state of the substrate 9 illustrated in FIG. 4. Note that the notch position in the combination included in the warpage-and-notch-position information does not necessarily have to be the position of the notch 93 at which the distance D2 becomes the smallest, and may be any position at which the distance D2 becomes smaller than in the case where the notch 93 is located at the other positions. Thus, the warpage-and-notch-position information may include a combination of the 0° notch position and a code that indicates the warped state of the substrate 9 illustrated in FIG. 4.

As described above, in the aforementioned substrate alignment apparatus, the motor 81 sequentially rotates a plurality of substrates 9 in the circumferential direction, the substrates 9 being to be supported in a horizontal posture from the underside by the substrate holder (e.g., batch hand 41). Then, the controller 100 controls the motor 81 on the basis of the warpage-and-notch-position information and the input information that is input about the warped state of the substrates 9, so as to determine the circumferential positions of the notches 93 of the substrates 9 and thereby to reduce the distance D2 in the thickness direction between the top of each substrate 9 that is held by the substrate holder and the area of contact of the peripheral portion of the substrate 9 with the substrate holder. As a result, it is possible to facilitate handling of the substrates 9 held by the substrate holder (i.e., holding, conveyance, or transfer of the substrates 9). Besides, in the case where the number of substrates 9 held by the substrate holder is counted by a counter, the decrease in the distance D2 of each substrate 9 allows the number of substrates 9 to be acquired with high precision.

The substrate alignment apparatus, the substrate arrangement apparatus, and the substrate processing apparatus 10 described above may be modified in various ways.

The substrate alignment mechanism 8 may be an apparatus having any of various types of structures as long as it is possible to align a plurality of substrates 9, each having a notch 93 in the peripheral portion. For example, the substrate alignment mechanism 8 may be a mechanism for rotating a plurality of substrates 9 simultaneously in the circumferential direction to determine the circumferential position of each of the notches 93 of the substrates 9. That is, the motor 81 of the substrate alignment mechanism 8 may be a rotor that rotates a plurality of substrates 9 either sequentially or simultaneously in the circumferential direction. In either case, it is possible to facilitate handling of a plurality of substrates 9 held by the substrate holder as described above. The substrate alignment mechanism 8 may also be a mechanism for rotating substrates 9 in a vertical posture either sequentially or simultaneously in the circumferential direction to change the circumferential orientations of the substrates 9. Moreover, the substrate alignment mechanism 8 may stop the rotation of the substrates 9 when the notches 93 of the substrates 9 have engaged with a predetermined engagement shaft.

The substrate holder that holds a plurality of substrates 9 aligned by the aforementioned substrate alignment apparatus is not limited to the up-and-down holder 61 of the pusher 6, the first and second lifters 27 and 28 of the substrate processing part 2, and the batch hand 41 of the carry-in-and-out mechanism 4, and may be any other portion of the substrate processing apparatus 10.

The aforementioned substrate alignment apparatus does not necessarily have to be included in the substrate processing apparatus 10, and may be provided outside and independently of the substrate processing apparatus 10. In this case, the controller 100 and the storage 101 in the substrate alignment apparatus may be provided independently of a controller and a storage in the substrate processing apparatus 10. A plurality of substrates 9 aligned by the substrate alignment apparatus may, for example, be housed in a FOUP 95 and carried into and processed by the substrate processing apparatus 10. Like the substrate alignment apparatus, the aforementioned substrate arrangement apparatus may also be provided outside the substrate processing apparatus 10. In this case, the controller 100 and the storage 101 in the substrate arrangement apparatus may be provided independently of a controller and a storage in the substrate processing apparatus 10. The substrate alignment apparatus and the substrate arrangement apparatus may be incorporated into and used by various apparatuses other than the aforementioned substrate processing apparatus 10.

The substrate processing apparatus 10 may be used to process glass substrates used in display devices such as liquid crystal displays, plasma displays, and field emission displays (FEDs), instead of semiconductor substrates. The substrate processing apparatus 10 may also be used to process other substrates such as optical disk substrates, magnetic disk substrates, magneto-optical disk substrates, photomask substrates, ceramic substrates, and solar-cell substrates.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention. This application claims priority benefit under 35 U.S.C. Section 119 of Japanese Patent Application No. 2016-190860 filed in the Japan Patent Office on Sep. 29, 2016, the entire disclosure of which is incorporated herein by reference.

REFERENCE SIGNS LIST

8 Substrate alignment mechanism
9 Substrate
10 Substrate processing apparatus
21 First liquid chemical tank
22 First rinsing liquid tank
23 Second liquid chemical tank
24 Second rinsing liquid tank
27 First lifter
28 Second lifter
41 Batch hand
52 Vertical holder
61 Up-and-down holder
62 Holder elevating mechanism
81 Motor
93 Notch
100 Controller
101 Storage
S11 to S13, S21, S22, S31, S32 Step

The invention claimed is:

1. A substrate alignment apparatus for aligning a plurality of substrates, each substrate having a notch in a peripheral portion, the apparatus comprising:
 a rotor for rotating a plurality of substrates either sequentially or simultaneously in a circumferential direction, said plurality of substrates being to be held in a vertical posture at a lower edge portion by a substrate holder;
 a storage for storing warpage-and-notch-position information that includes a plurality of combinations of a warped state of said plurality of substrates and a notch position at which a substrate in said warped state is held in a proper posture by said substrate holder; and
 a controller for controlling said rotor,
 wherein said controller controls said rotor on the basis of said warpage-and-notch-position information and input information that is input about the warped state of said plurality of substrates, to rotate said plurality of substrates either sequentially or simultaneously in said circumferential direction and determine positions in said circumferential direction of said notches of said plurality of substrates and thereby to reduce a distance in a thickness direction between a lower edge portion and an upper edge of said each substrate that is held by said substrate holder.

2. The substrate alignment apparatus according to claim 1, wherein
 said each substrate is curved in a first radial direction to one side in said thickness direction with a first curvature, and
 said each substrate is curved in a second radial direction orthogonal to said first radial direction to said one side in said thickness direction with a second curvature greater than said first curvature.

3. The substrate alignment apparatus according to claim 1, wherein
 said each substrate is curved in a first radial direction to one side in said thickness direction, and
 said each substrate is curved in a second radial direction orthogonal to said first radial direction to the other side in said thickness direction.

4. A substrate processing apparatus comprising:
 the substrate alignment apparatus according to claim 1;
 said substrate holder for holding said plurality of substrates aligned by said substrate alignment apparatus; and
 a liquid processing part for retaining a processing liquid in which said plurality of substrates held by said substrate holder are to be immersed.

5. A substrate arrangement apparatus comprising:
 the substrate alignment apparatus according to claim 1;
 said substrate holder for holding said plurality of substrates aligned by said substrate alignment apparatus; and
 a substrate arrangement mechanism for disposing each of said plurality of substrates held by said substrate holder between each pair of another plurality of substrates that are held by another substrate holder.

6. A substrate alignment apparatus for aligning a plurality of substrates, each substrate having a notch in a peripheral portion, the apparatus comprising:
 a rotor for rotating a plurality of substrates either sequentially or simultaneously in a circumferential direction, said plurality of substrates being to be supported in a horizontal posture at a lower surface by a substrate holder;

a storage for storing warpage-and-notch-position information that includes a plurality of combinations of a warped state of said plurality of substrates and a notch position at which a substrate in said warped state is held in a proper posture by said substrate holder; and a controller for controlling said rotor, wherein said controller controls said rotor on the basis of said warpage-and-notch-position information and input information that is input about the warped state of said plurality of substrates, to rotate said plurality of substrates either sequentially or simultaneously in said circumferential direction and determine positions in said circumferential direction of said notches of said plurality of substrates and thereby to reduce a distance in a thickness direction between a top of said each substrate that is held by said substrate holder and an area of contact of said peripheral portion of said each substrate with said substrate holder.

7. The substrate alignment apparatus according to claim 6, wherein said each substrate is curved in a first radial direction to one side in said thickness direction with a first curvature, and said each substrate is curved in a second radial direction orthogonal to said first radial direction to said one side in said thickness direction with a second curvature greater than said first curvature.

8. The substrate alignment apparatus according to claim 6, wherein said each substrate is curved in a first radial direction to one side in said thickness direction, and said each substrate is curved in a second radial direction orthogonal to said first radial direction to the other side in said thickness direction.

9. A substrate alignment method for aligning a plurality of substrates, each substrate having a notch in a peripheral portion, the method comprising:

a) storing warpage-and-notch-position information that includes a plurality of combinations of a warped state of a plurality of substrates and a notch position, said plurality of substrates being to be held in a vertical posture at a lower edge portion by a substrate holder, and said notch position being a position at which a substrate in said warped state is held in a proper posture by said substrate holder;

b) rotating said plurality of substrates either sequentially or simultaneously in a circumferential direction; and c) after said operation b), either sequentially or simultaneously determining positions in said circumferential direction of the notches of said plurality of substrates that have been aligned, wherein in said operation c), the position in said circumferential direction of said notch of said each substrate is determined on the basis of said warpage-and-notch-position information and input information that is input about the warped state of said plurality of substrates, to reduce a distance in a thickness direction between a lower edge portion and an upper edge of said each substrate that is held by said substrate holder.

10. A substrate processing method comprising:

by using the substrate alignment method according to claim 9, aligning said plurality of substrates;

holding said plurality of substrates aligned by said substrate alignment method by said substrate holder; and immersing said plurality of substrates held by said substrate holder in a processing liquid.

11. A substrate arrangement method comprising:

by using the substrate alignment method according to claim 9, aligning said plurality of substrates;

holding said plurality of substrates aligned by said substrate alignment method by said substrate holder; and disposing each of said plurality of substrates held by said substrate holder between each pair of another plurality of substrates that are held by another substrate holder.

12. A substrate alignment method for aligning a plurality of substrates, each substrate having a notch in a peripheral portion, the method comprising:

a) storing warpage-and-notch-position information that includes a plurality of combinations of a warped state of a plurality of substrates and a notch position, said plurality of substrates being to be supported in a horizontal posture at a lower surface by a substrate holder, and said notch position being a position at which a substrate in said warped state is held in a proper posture by said substrate holder;

b) rotating said plurality of substrates either sequentially or simultaneously in a circumferential direction; and c) after said operation b), either sequentially or simultaneously determining positions in said circumferential direction of the notches of said plurality of substrates that have been aligned, wherein in said operation c), the positions in said circumferential direction of said notches of said plurality of substrates are determined on the basis of said warpage-and-notch-position information and input information that is input about the warped state of said plurality of substrates, to reduce a distance in a thickness direction between a top of said each substrate that is held by said substrate holder and an area of contact of said peripheral portion of said each substrate with said substrate holder.

* * * * *